United States Patent
Conte et al.

(10) Patent No.: US 10,818,368 B2
(45) Date of Patent: Oct. 27, 2020

(54) LEVEL SHIFTER CIRCUIT HAVING TWO-DOMAIN LEVEL SHIFTING CAPABILITY

(71) Applicant: STMicroelectronics S.r.l., Agrate Brianza (MB) (IT)

(72) Inventors: Antonino Conte, Tremestieri Etneo (IT); Leopoldo Maria Marino, Palermo (IT); Maurizio Francesco Perroni, Furnari (IT); Salvatore Polizzi, Palermo (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/294,386

(22) Filed: Mar. 6, 2019

(65) Prior Publication Data

US 2019/0287633 A1    Sep. 19, 2019

(30) Foreign Application Priority Data

Mar. 15, 2018 (IT) .......................... 102018000003622

(51) Int. Cl.

| | | |
|---|---|---|
| G11C 8/08 | (2006.01) | |
| G11C 16/34 | (2006.01) | |
| G11C 5/14 | (2006.01) | |
| G11C 16/20 | (2006.01) | |
| H03K 19/00 | (2006.01) | |
| H03K 19/0175 | (2006.01) | |

(Continued)

(52) U.S. Cl.
CPC .......... *G11C 16/3445* (2013.01); *G11C 5/145* (2013.01); *G11C 8/06* (2013.01); *G11C 8/08* (2013.01); *G11C 8/10* (2013.01); *G11C 13/0004* (2013.01); *G11C 13/0026* (2013.01); *G11C 13/0028* (2013.01); *G11C 16/20* (2013.01); *H03K 19/0016* (2013.01); *H03K 19/0175* (2013.01); *H03K 19/018507* (2013.01)

(58) Field of Classification Search
CPC ....................................................... G11C 8/08
USPC ....................................... 365/189.11, 230.06
See application file for complete search history.

(56) References Cited

U.S. PATENT DOCUMENTS

| | | | | |
|---|---|---|---|---|
| 6,064,250 A | * | 5/2000 | Proebsting | G05F 3/205 327/536 |
| 7,199,639 B2 | * | 4/2007 | Kanno | H03K 19/0016 327/333 |

(Continued)

*Primary Examiner* — Son L Mai
(74) *Attorney, Agent, or Firm* — Slater Matsil, LLP

(57) ABSTRACT

A level shifter circuit configured to shift an input signal switching within a first voltage range to generate a first output signal correspondingly switching within a second voltage range higher than the first voltage range. The level shifter circuit including a latching core having latching input and output terminals and a supply line configured to be supplied by a supply voltage, and a reference line configured to be coupled to a reference voltage. Capacitive coupling elements are coupled to the latching input and output terminals of the latching core. A driving stage is configured to bias the capacitive coupling elements with biasing signals generated based on the input signal. A decoupling stage is configured to be driven by the driving stage through the capacitive coupling elements to decouple the supply line from the supply voltage and the reference line from the reference voltage during switching of the input signal.

20 Claims, 8 Drawing Sheets

(51) Int. Cl.
*G11C 8/06* (2006.01)
*G11C 13/00* (2006.01)
*H03K 19/0185* (2006.01)
*G11C 8/10* (2006.01)

(56) References Cited

U.S. PATENT DOCUMENTS

| | | | |
|---|---|---|---|
| 7,795,946 B2* | 9/2010 | Kim | H03K 3/356113 |
| | | | 326/63 |
| 2002/0080651 A1 | 6/2002 | Tanzawa et al. | |
| 2002/0180508 A1 | 12/2002 | Kanno et al. | |
| 2008/0048754 A1* | 2/2008 | Woo | H03K 3/35613 |
| | | | 327/333 |
| 2013/0222036 A1* | 8/2013 | Kwon | H03K 3/356113 |
| | | | 327/333 |
| 2018/0061495 A1 | 3/2018 | Conte et al. | |

\* cited by examiner

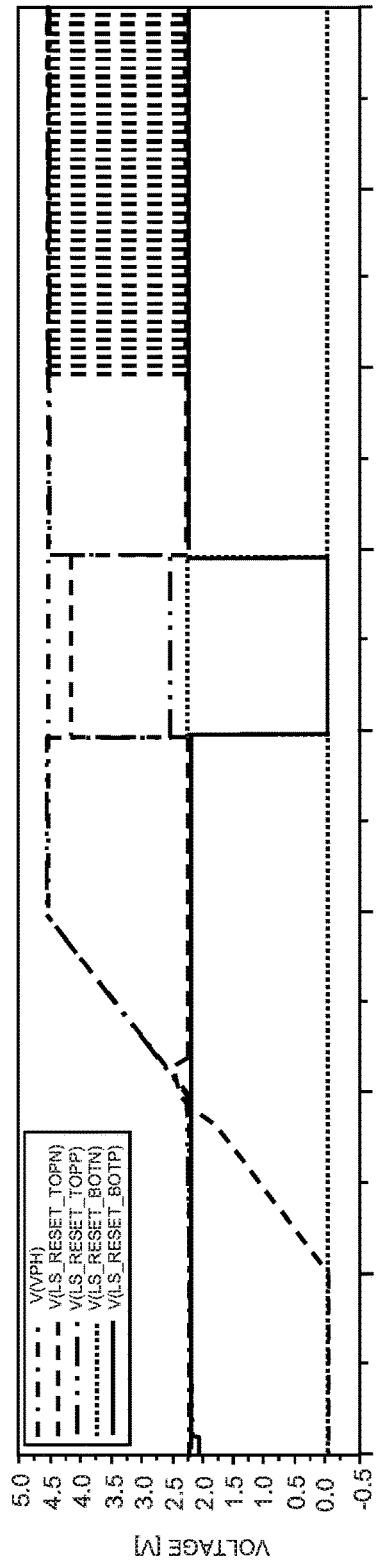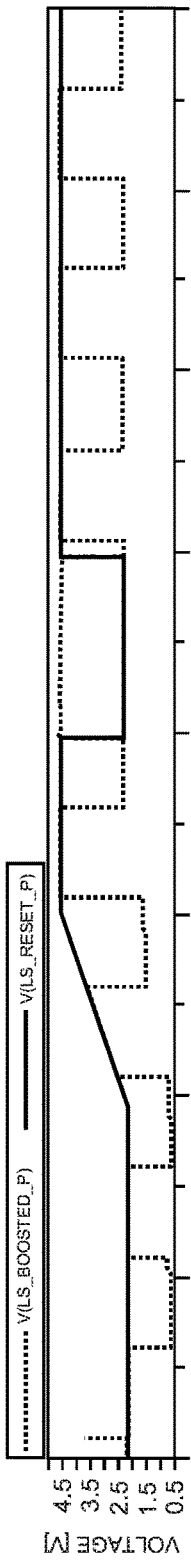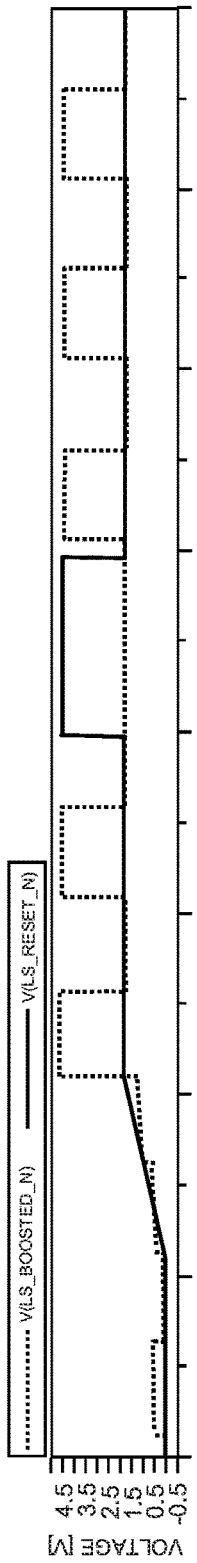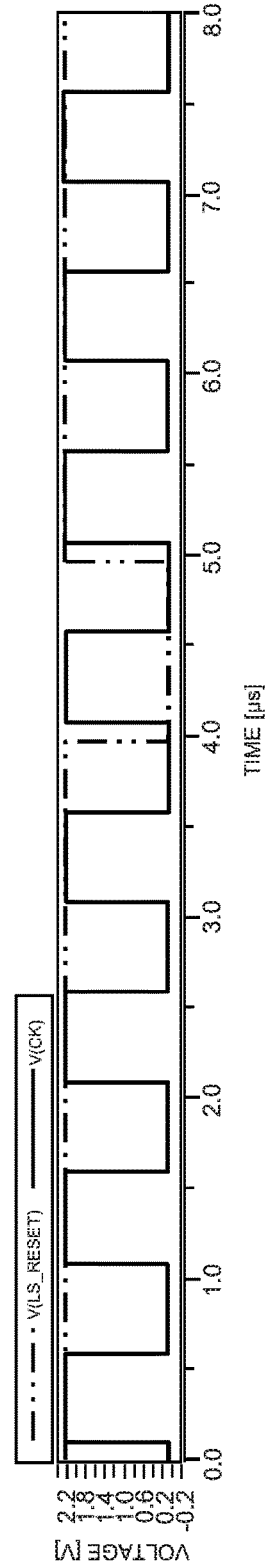
Fig. 7A
Fig. 7B
Fig. 7C
Fig. 7D

LEVEL SHIFTER CIRCUIT HAVING TWO-DOMAIN LEVEL SHIFTING CAPABILITY

CROSS-REFERENCE TO RELATED APPLICATIONS

This application claims priority to Italian Patent Application No. 102018000003622, filed on Mar. 15, 2018, which application is hereby incorporated herein by reference.

TECHNICAL FIELD

The present invention relates generally to an electronic system and method, and, in particular embodiments, to a level shifter circuit having two-domain level shifting capability, and an associated memory device.

BACKGROUND

As it is known, level shifter circuits (in short, level shifters) have several applications, wherever it is required to interface two or more circuits operating at different voltage levels.

Level shifters are used in non-volatile memory devices, for example of a phase-change memory (PCM) type, where storage of information is obtained by exploiting phase-change materials (e.g., "chalcogenides" or "chalcogenic materials"), having the property of switching between phases that have resistivity of considerably different value.

In these memory devices, an internal supply voltage is present (the so-called logic supply voltage $V_{dd}$, with low voltage values, for example comprised between 1 V and 1.35 V). In order to perform reading and writing (programming or erasing) operations on the contents of the memory cells, use of higher operating voltages, for example up to values of 4.5 V, is required.

Due to the different ranges of values of the voltages present in these memory devices, use of level shifter circuits is required in order to interface and operatively couple low-voltage and high-voltage circuit portions.

In particular, it is often required to have two distinct level-shifted voltage domains, i.e., a medium-voltage domain (with voltages in the range between a ground reference and a medium, or intermediate, voltage level, e.g., 2.25 V) and a high-voltage domain (with voltages in the range between the medium voltage level and a high voltage level, e.g., 4.5 V).

For example, in non-volatile memory application, particularly in PCM memories, row and column decoders require voltages shifted in the medium-voltage and high-voltage domains for their operation (as will also be discussed in the following).

Common desired requirements for the level shifters, particularly for memory applications, are fast level transitions, low power consumption and small area occupation.

It is also a desired requirement that level shifting operations in the medium-voltage and high-voltage domains are performed in parallel, with minimum delays between the level transitions, for example in order to avoid current cross-conductions in corresponding NMOS and PMOS transistors. Another common desired requirement is for the level shifter to offer flexibility as regards the supply voltage values that may be applied.

SUMMARY

One or more embodiments relate to a level shifter circuit having improved efficiency, in particular for use in a memory device, and to a corresponding memory device, in particular of a non-volatile type.

The present Applicant has realized that known level shifters solutions are not satisfactory in meeting the above requirements.

One or more embodiments relate to an improved solution for a level shifter circuit.

According to the present invention, a level shifter circuit, and a corresponding memory device are consequently provided as defined in the annexed claims.

BRIEF DESCRIPTION OF THE DRAWINGS

For a better understanding of the present invention, preferred embodiments thereof are now described, purely by way of non-limiting example and with reference to the attached drawings, wherein:

FIGS. 7A-7D show plots of electrical quantities related to operation of the reset buffer stage;

DETAILED DESCRIPTION OF ILLUSTRATIVE EMBODIMENTS

Figure 1:
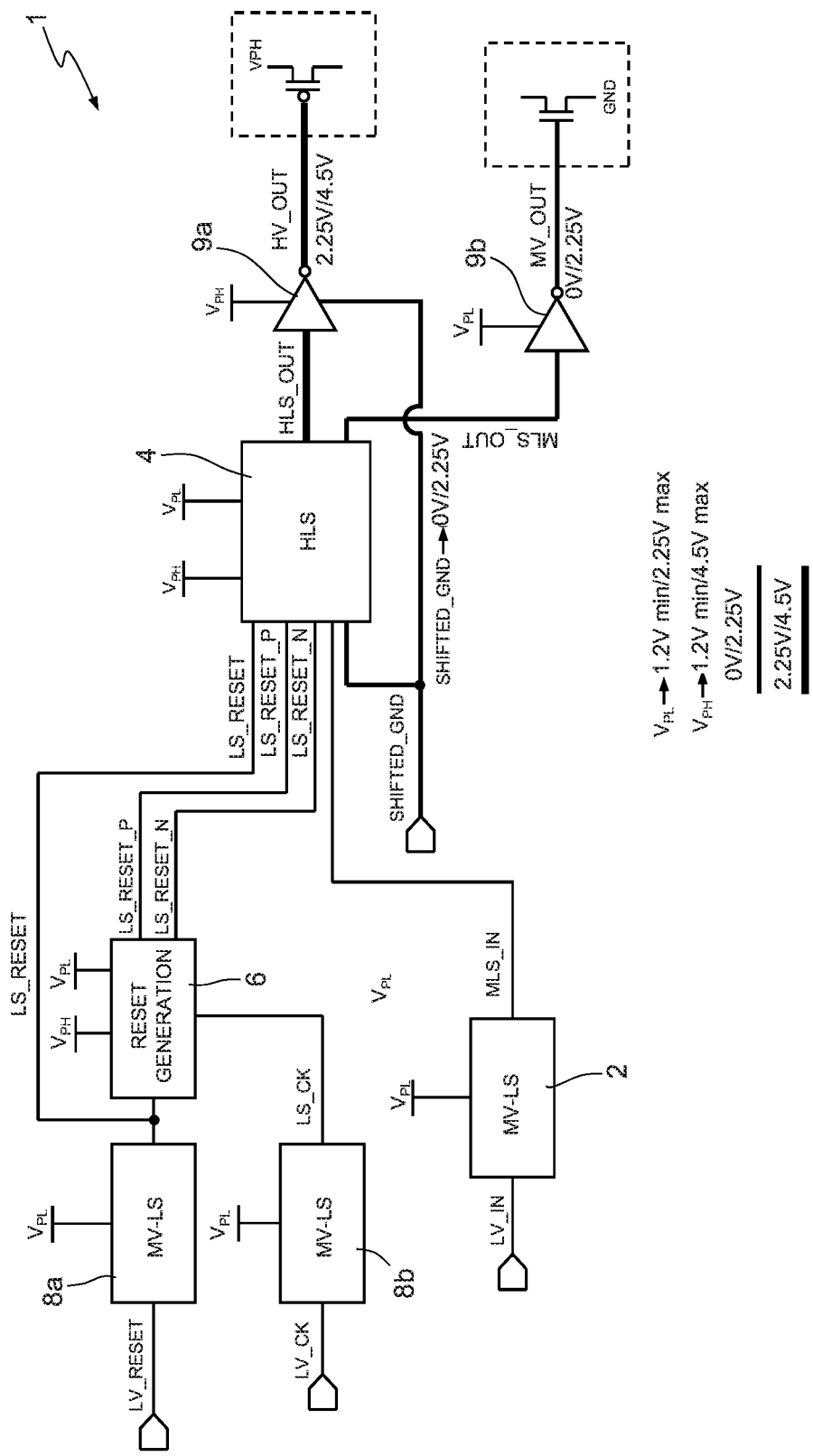
FIG. 1 shows a schematic block diagram of a level shifter circuit, according to an embodiment of the present solution.

With initial reference to FIG. 1, an embodiment of a level shifter circuit, designated as a whole by 1, is now described.

The level shifter circuit 1 comprises an input stage 2, which receives an input signal LV_IN at a low voltage level, i.e., in a range [GND, $V_{dd}$], where $V_{dd}$ is a logic supply voltage with a value that is, for example, comprised between 1 V and 1.35 V; and provides at the output a medium level shifted input voltage MLS_IN, in the medium-voltage domain, with voltages in the range [GND, $V_{PL}$], between the ground reference GND and an intermediate supply voltage $V_{PL}$ at medium voltage, with a value greater than the logic supply voltage $V_{dd}$, for example comprised between 1.2 V and 2.25 V (in the exemplary application for a non-volatile memory, the value of the intermediate supply voltage $V_{PL}$ may depend on the memory operation being performed, being it a reading or a writing operation).

Figure 2:
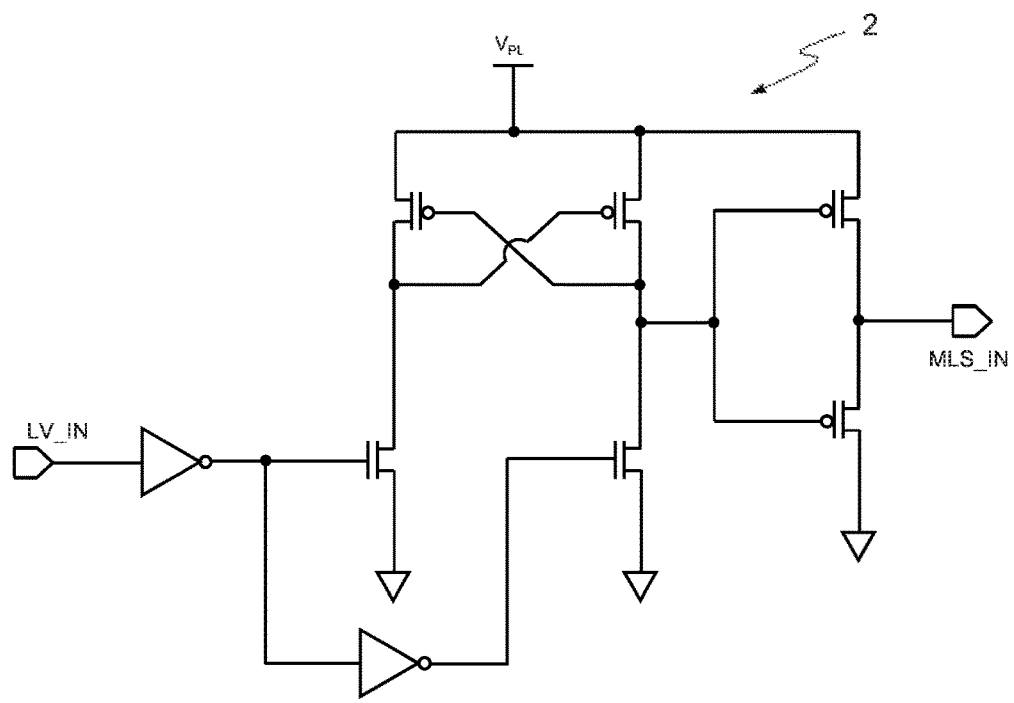
FIG. 2 shows a possible circuit configuration of an input stage for medium voltage level shifting operations in the level shifter circuit of FIG. 1.

The input stage 2 implements a medium voltage shifting of the input signal LV_IN, and may have any known circuit configuration suitable for medium voltage shifting. For example, FIG. 2 shows a possible circuit configuration (here not disclosed in detail) for the input stage 2, implementing medium-voltage level shifting of the input signal LV_IN to generate the corresponding medium-level shifted input voltage MLS_IN.

The level shifter circuit 1 further comprises (see again FIG. 1) a high-level shifting stage 4 having a signal input receiving the medium-level shifted input voltage MLS_IN, and a first output. The first output provides a corresponding high-level shifted output voltage HLS_OUT in the range $[V_{PL}, V_{PH}]$ between the intermediate supply voltage $V_{PL}$ and a high supply voltage $V_{PH}$, the high supply voltage $V_{PH}$ having a value greater than the intermediate supply voltage $V_{PL}$. For example, in some embodiments, the high supply voltage $V_{PH}$ may be comprised between 1.2 V and 4.5 V (in the exemplary application for a non-volatile memory, the value of the high supply voltage $V_{PH}$ may depend on the memory operation being performed, being it a reading or a writing operation). The high-level shifting stage 4 thus has: a first supply input receiving the intermediate supply voltage $V_{PL}$ and a second supply input receiving the high supply voltage $V_{PH}$. The high-level shifting stage 4 also includes a shifted-ground input receiving a level-shifted ground reference SHIFTED_GND having a voltage value higher than the ground reference GND, in the present embodiment equal to 2.25 V.

According to an aspect of some embodiments, the high-level shifting stage 4 also has a second output providing a corresponding medium-level shifted output voltage MLS_OUT, in the range $[GND, V_{PL}]$, which has corresponding and substantially simultaneous transitions as the high-level shifted output voltage HLS_OUT.

Moreover, the high-level shifting stage 4 has: a first reset input receiving a level shifted input reset signal LS_RESET in the medium-voltage domain $[GND, V_{PL}]$; a second reset input receiving a first high-level shifted input reset signal LS_RESET_P in the high-voltage domain $[V_{PL}, V_{PH}]$; and a third reset input receiving a second high-level shifted input reset signal LS_RESET_N also in the high-voltage domain $[V_{PL}, V_{PH}]$, with opposite level transitions with respect to the first high-level shifted input reset signal LS_RESET_P.

The level shifter circuit 1 further comprises a reset generation stage 6 having an input receiving the level shifted input reset signal LS_RESET and configured to perform high-level shifting operations to generate, at a first reset output, the first high-level shifted input reset signal LS_RESET_P, and, at a second reset output, the second high-level shifted input reset signal LS_RESET_N. The first high-level shifted input reset signal LS_RESET_P and the second high-level shifted input reset signal LS_RESET_N both have transitions corresponding to the level shifted input reset signal LS_RESET. The reset generation stage 6 also has respective first and a second supply inputs receiving the intermediate supply voltage $V_{PL}$ and, respectively, the high supply voltage $V_{PH}$. The reset generation stage 6 also has a clock input, receiving a level-shifted clock signal LS_CK, as a timing signal, also being in the medium-voltage domain $[GND, V_{PL}]$.

In particular, the level shifted input reset signal LS_RESET is generated by a first medium-voltage shifting stage 8a, which receives at an input a low-voltage input reset signal LV_RESET. The level-shifted clock signal LS_CK is generated by a second medium-voltage shifting stage 8b, which receives at a respective input a low-voltage input clock signal LV_CK. Both first and second medium-voltage shifting stages 8a, 8b can be implemented in any known manner, for example with a circuit corresponding to that shown in FIG. 2.

In the embodiment shown in FIG. 1, the level shifter circuit 1 moreover comprises: a first inverting stage 9a, supplied by the high supply voltage $V_{PH}$, that receives the high-level shifted output voltage HLS_OUT from the high-level shifting stage 4 and provides, at a first output terminal of the same level shifter circuit 1, a first output voltage HV_OUT, with transitions in the high-voltage domain $[V_{PL}, V_{PH}]$ (in the example, switching between 2.25 V and 4.5 V). A second inverting stage 9b that is supplied by the intermediate supply voltage $V_{PL}$, receives the medium-level shifted output voltage MLS_OUT from the same high-level shifting stage 4 and provides, at a second output terminal of the same level shifter circuit 1, a second output voltage MV_OUT, with corresponding and simultaneous transitions in the medium-voltage domain $[GND, V_{PL}]$ (in the example, switching between 0 V and 2.25 V).

As schematically shown, the first output voltage HV_OUT can be provided, for example, to the base terminal of a PMOS transistor having a conduction terminal coupled to the high supply voltage $V_{PH}$ to switch the same PMOS transistor in an ON or OFF state. In a corresponding manner, the second output voltage MV_OUT can be provided, for example, to the base terminal of a NMOS transistor having a conduction terminal coupled to the ground reference GND to switch the same NMOS transistor in an ON or OFF state.

Figure 3:
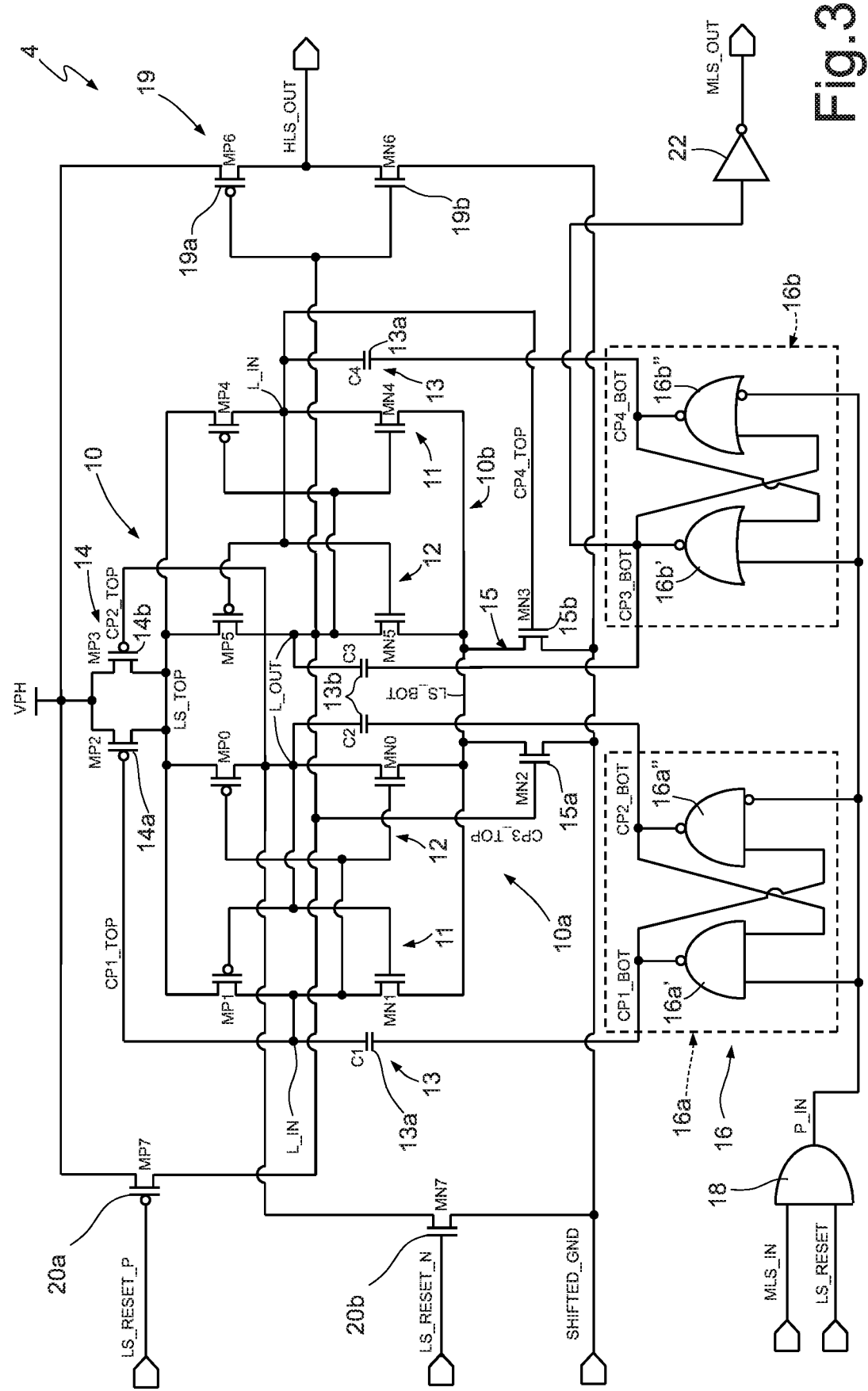
FIG. 3 shows a detailed circuit diagram of a high-voltage level shifter stage in the level shifter circuit of FIG. 1.

With reference to FIG. 3, an embodiment of the high level shifting stage 4 is now discussed in greater details.

The high level shifting stage 4 includes a latching (or holding) core 10, which is configured to switch its latching state in response to the transitions of the medium level shifted input voltage MLS_IN and to maintain the latching state until a next transition of the same medium level shifted input voltage MLS_IN, or a reset input, is received.

The latching core 10 includes a first and a second latching units 10a, 10b, each comprising a respective first and second latch inverters 11, 12, cross-coupled between a respective latching input L_IN and a respective latching output L_OUT and having a first biasing input and a second biasing input, coupled to a top level-shifted line LS_TOP and, respectively, a bottom level-shifted line LS_BOT.

Each of the first and second inverters 11, 12 includes a respective couple of NMOS and PMOS transistors (denoted as MN0-MP0 and MN1-MP1 for the first latching unit 10a and as MN4-MP4 and MN5-MP5 for the second latching unit 10b), with first conduction terminals coupled to the bottom level-shifted line LS_BOT and the top level-shifted line LS_TOP, second conduction terminals coupled together and to the latching output L_OUT or latching input L_IN, and gate terminals coupled together and to the latching output L_OUT or latching input L_IN.

The high level shifting stage 4 further includes a capacitive coupling unit 13 for each latching unit 10a, 10b, comprising a first coupling capacitor 13a, having a top plate coupled to the latching input L_IN of the respective latching unit 10a, 10b, and a second coupling capacitor 13b, having a top plate coupled to the latching output L_OUT of the respective latching unit 10a, 10b.

The high level shifting stage 4 moreover comprises a first and a second decoupling units 14, 15, the first decoupling unit 14 operable to selectively couple/decouple the top level-shifted line LS_TOP to/from a line set at the high supply voltage $V_{PH}$, and the second decoupling unit 15 operable to selectively couple/decouple the bottom level-shifted line LS_BOT to/from a line set at the level-shifted ground reference SHIFTED_GND.

In particular, the first decoupling unit 14 includes a first and a second PMOS decoupling transistors 14a, 14b coupled between the top level-shifted line LS_TOP and the line at the high supply voltage $V_{PH}$ and having gate, or control, terminals coupled to the top plate of the first coupling capacitor 13a and, respectively, to the top plate of the second coupling capacitor 13b of the capacitive coupling unit 13 coupled to the first latching unit 10a, receiving respective biasing signals CP1_TOP, CP2_TOP.

In a corresponding manner, the second decoupling unit 15 includes a first and a second NMOS decoupling transistors 15a, 15b coupled between the bottom level-shifted line LS_BOT and the line at the level-shifted ground reference SHIFTED_GND and having gate, or control, terminals coupled to the top plate of the first coupling capacitor 13a and, respectively, to the top plate of the second coupling capacitor 13b of the capacitive coupling unit 13 coupled to the second latching unit 10b, receiving respective biasing signals CP3_TOP, CP4_TOP.

The high level shifting stage 4 further comprises a driving stage 16 including a first and a second driving units 16a, 16b, of a logic type, the first driving unit 16a being configured to bias the bottom plates of the first and second coupling capacitors 13a, 13b of the first latching unit 10a with respective biasing signals CP1_BOT, CP2_BOT; and the second driving unit 16b being configured to drive the bottom plates of the first and second coupling capacitors 13a, 13b of the second latching unit 10b with respective biasing signals CP3_BOT, CP4_BOT.

According to a particular aspect of the present solution, the first and second driving units 16a, 16b are configured to generate the respective biasing signals CP1_BOT, CP2_BOT and CP3_BOT, CP4_BOT, having overlapping values during switching of the medium level shifted input voltage MLS_IN (i.e., in response to shifting of the value of the input signal LV_IN).

In particular, the first driving unit 16a is of the NAND logic type and is configured to generate the respective biasing signals CP1_BOT, CP2_BOT with positive overlapping values during switching of the medium level shifted input voltage MLS_IN, so as to drive (as will also be detailed in the following) the gate terminals of the first and second PMOS decoupling transistors 14a, 14b of the first decoupling unit 14 both at a high value (corresponding to the high supply voltage $V_{PH}$), thus turning off the same PMOS decoupling transistors 14a, 14b and decoupling the top level-shifted line LS_TOP from the line at the high supply voltage $V_{PH}$ during switching of the medium level shifted input voltage MLS_IN.

In a corresponding manner, the second driving unit 16b is of the NOR logic type and is configured to generate the respective biasing signals CP3_BOT, CP4_BOT with negative overlapping values during switching of the medium level shifted input voltage MLS_IN, so as to drive (as will also be detailed in the following) the gate terminals of the first and second NMOS decoupling transistors 15a, 15b of the second decoupling unit 15 both at a low value (corresponding to the level-shifted ground reference SHIFTED_GND), thus turning off the same NMOS decoupling transistors 15a, 15b and decoupling the bottom level-shifted line LS_BOT from the line at the level-shifted ground reference SHIFTED_GND during switching of the medium level shifted input voltage MLS_IN.

Both the first and the second driving units 16a, 16b receive a common biasing (or polarization) input P_IN, which is generated at the output of a AND logic gate 18, receiving at its inputs the medium level shifted input voltage MLS_IN and the level shifted input reset signal LS_RESET.

In more details, the first driving unit 16a includes a first and a second NAND logic gates 16a', 16a", wherein: the first NAND logic gate 16a' has a first input coupled to the output of the AND logic gate 18 receiving the biasing input P_IN, a second input coupled to the output of the second NAND logic gate 16a", and an output coupled to the bottom plate of the first coupling capacitor 13a of the first latching unit 10a; and the second NAND logic gate 16a" has a first, negated, input coupled to the output of the AND logic gate 18 and receiving the negated biasing input, a second input coupled to the output of the first NAND logic gate 16a', and an output coupled to the bottom plate of the second coupling capacitor 13b of the first latching unit 10a.

The second driving unit 16b includes a first and a second NOR logic gates 16b', 16b", where: the first NOR logic gate 16b' has a first input coupled to the output of the AND logic gate 18 and receiving the biasing input P_IN, a second input coupled to the output of the second NOR logic gate 16b", and an output coupled to the bottom plate of the first coupling capacitor 13a of the second latching unit 10b. The second NOR logic gate 16b" has a first, negated, input coupled to the output of the AND logic gate 18 and receiving the negated biasing input, a second input coupled to the output of the first NOR logic gate 16b', and an output coupled to the bottom plate of the second coupling capacitor 13b of the second latching unit 10b.

The high-level shifting stage 4 further comprises an output inverter unit 19, having an input coupled to the latching output L_OUT of the second latching unit 10b (and to the top plate of the second coupling capacitor 13b of the second latching unit 10b), and an output defining the first output of the high-level shifting stage 4 providing the high-level shifted output voltage HLS_OUT.

In more details, the output inverter unit 19 includes a PMOS transistor 19a having a first conduction terminal coupled to the line at the high supply voltage $V_{PH}$, a second conduction terminal coupled to the first output of the high-level shifting stage 4, and a gate terminal coupled to the top plate of the second coupling capacitor 13b of the second latching unit 10b and receiving the control signals CP3_TOP. The output inverter unit 19 also includes an NMOS transistor 19b having a first conduction terminal coupled to the line at the level-shifted ground reference SHIFTED_GND, a second conduction terminal coupled to the first output of the high-level shifting stage 4, and a gate terminal coupled to the top plate of the second coupling capacitor 13b of the second latching unit 10b and receiving the same control signals CP3_TOP.

Moreover, the high-level shifting stage 4 comprises: a first reset transistor 20a, of the PMOS type, having a first conduction terminal coupled to the line at the high supply voltage $V_{PH}$, a second conduction terminal coupled to the latching output L_OUT of the second latching unit 10b (and to the top plate of the second coupling capacitor 13b of the same second latching unit 10b), and a gate terminal coupled to the second reset input of the high-level shifting stage 4, receiving the first high-level shifted input reset signal LS_RESET_P. The high-level shifting stage 4 also includes a second reset transistor 20b, of the NMOS type, having a first conduction terminal coupled to the line at the level-shifted ground reference SHIFTED_GND, a second conduction terminal coupled to the latching output L_OUT of the first latching unit 10a (and to the top plate of the second coupling capacitor 13b of the same first latching unit 10a), and a gate terminal coupled to the third reset input of the same high-level shifting stage 4, receiving the second high-level shifted input reset signal LS_RESET_N.

The high-level shifting stage 4 further comprises an output inverting buffer 22 having an input coupled to the output of the first NOR logic gate 16b' of the second driving unit 16b (and the bottom plate of the second coupling capacitor 13b of the second latching unit 10b), receiving the biasing signal CP3_BOT, and an output defining the second output of the high-level shifting stage 4 providing the medium-level shifted output voltage MLS_OUT.

Operation of the high-level shifting stage 4 is now discussed, also referring to the plots of the relevant signals shown in FIGS. 4A, 4B, 5A, and 5B.

In general, operation of the high-level shifting stage 4 is based on inputting the switching transitions of the medium level shifted input voltage MLS_IN into the latching core 10 via capacitive coupling, through the capacitive coupling units 13, determining shifting of the biasing signals and switching of the latching state.

According to a particular aspect of some embodiments, local supply to the first and second latching units 10a, 10b is cut-off during switching, driving in the OFF state both decoupling transistors 14a, 14b and 15a, 15b of the first and second decoupling units 14, 15. In this manner, energy used for switching is greatly reduced and, also, switching speed is greatly increased, since the latching units 10a, 10b are set in the proper switching state when the local supply to the same latching units 10a, 10b is restored, thereby providing a very fast switching of the high-level shifted output voltage HLS_OUT and of the medium-level shifted output voltage MLS_OUT.

According to the above, advantageously, reduced capacitance values and minimum-sized transistors may be used in the level shifter circuit 1, with a great saving in term of area occupation.

In more details, let's suppose that the medium level shifted input voltage MLS_IN switches from the low (GND) to a high value (i.e., equal to the intermediate supply voltage $V_{PL}$) for a 0→1 switching transition, with the level shifted input reset signal LS_RESET being inactive (in this case, as will be discussed in detail also in the following, being at the high level, i.e., equal to the intermediate supply voltage $V_{PL}$).

Before switching, the output of the first NAND logic gate 16a' of the first driving unit 16a is in the high state ('1'), while the output of the second NAND logic gate 16a" of the same first driving unit 16a is in the low state ('0').

At the rising edge of the medium level shifted input voltage MLS_IN, the output of the second NAND logic gate 16a" immediately switches to the high state, while the output of the first NAND logic gate 16a' is still in the high state; indeed, switching of the output of the first NAND logic gate 16a' to the low state may occur only after a certain delay, due to propagation delay of the signals from the second NAND logic gate 16a".

Figure 4A:
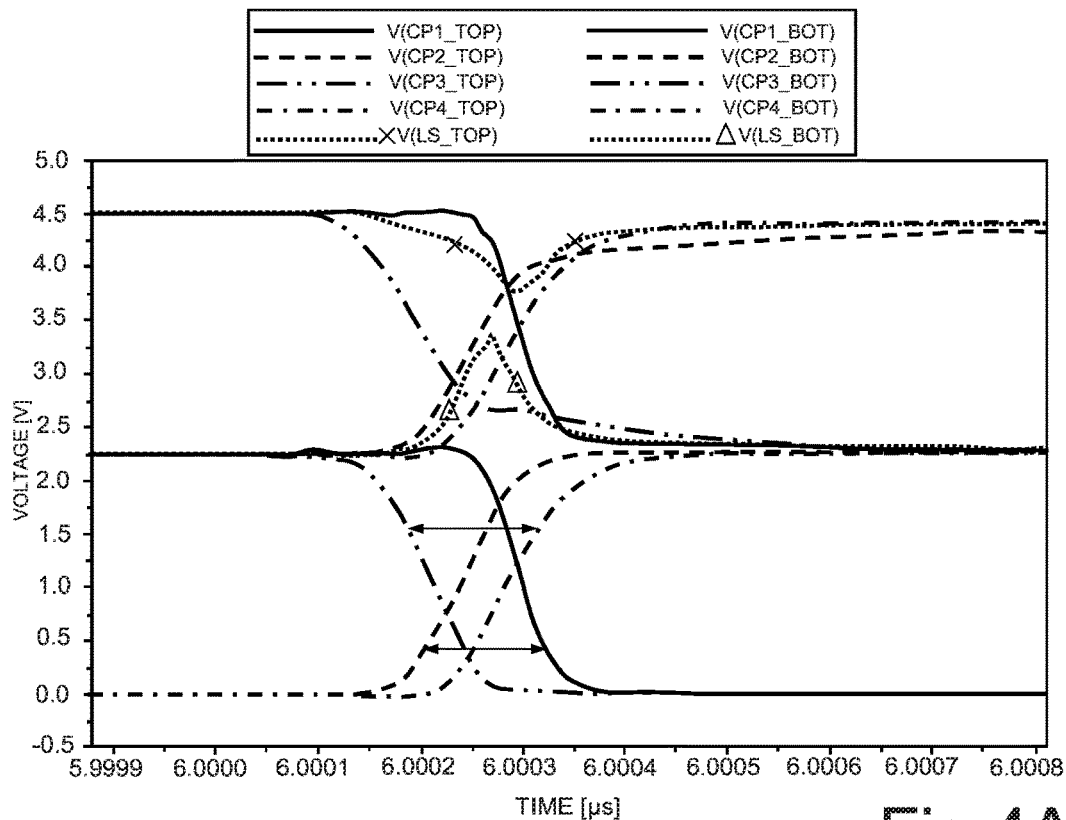
FIGS. 4A-4B and 5A-5B show plots of electrical quantities related to operation of the high-voltage level shifter stage.
Figure 4B:
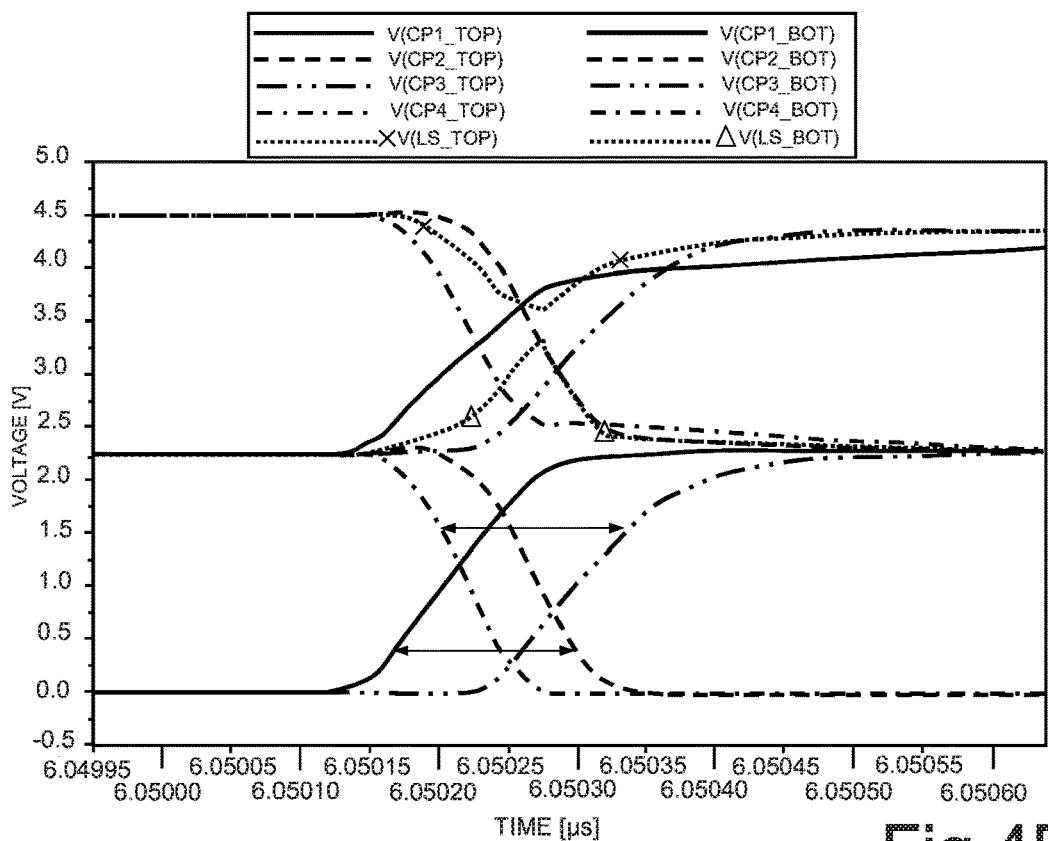

Therefore, there is a time interval, during switching, e.g., in the order of 100-150 ps ($10^{-12}$ s), in which biasing signals CP1_BOT, CP2_BOT are overlapping at the high level (this time interval is shown with the arrow in FIG. 4A, relating to the 0→1 switching transition). In particular, the gate terminal of the first decoupling transistor 14a is already high (causing turn-off of the first decoupling transistor 14a), while the gate terminal of the second decoupling transistor 14b is switching in the same high state (thereby causing turn-off also of the second decoupling transistor 14b). Accordingly, the top level-shifted line LS_TOP is decoupled or isolated from the line at the high supply voltage $V_{PH}$ (i.e., it is connected to the same high supply voltage $V_{PH}$ via a very high resistance) during switching of the medium level shifted input voltage MLS_IN.

Operation of the second driving unit 16b substantially corresponds to what discussed above for the first driving unit 16a.

In this case, before switching, the output of the second NOR logic gate 16b" of the second driving unit 16b is initially in the low state ('0'), while the output of the first NOR logic gate 16b' is in the high state ('1').

At the rising edge of the medium level shifted input voltage MLS_IN, the output of the first NOR logic gate 16b' immediately switches to the low state, while the output of the second NOR logic gate 16b" is still in the low state. Indeed, switching of the output of the second NOR logic gate 16b" to the high state may occur only after a certain delay, due to the propagation of the signals from the first NOR logic gate 16b'.

Therefore, the above discussed time interval occurs, during switching, in which biasing signals CP3_BOT, CP4_BOT are overlapping, in this case, at the low level (this time interval is also shown with the arrow in FIG. 4A). In particular, the gate terminal of the second decoupling transistor 15b is already low (causing turn-off of the same second decoupling transistor 15b), while the gate terminal of the first decoupling transistor 15a is switching in the same low state (thereby causing turn-off also of the first decoupling transistor 15a). Accordingly, also the bottom level-shifted line LS_BOT is decoupled or isolated from the line at the level-shifted ground reference SHIFTED_GND (i.e., it is connected to the same level-shifted ground reference SHIFTED_GND via a very high resistance) during switching of the medium level shifted input voltage MLS_IN.

As shown in FIG. 4A, a drop of the local supply voltage to the latching core 10 therefore occurs (i.e., a drop of the voltage at the top and bottom level-shifted lines LS_TOP, LS_BOT), which facilitates latch switching. The first and second latching units 10a, 10b are isolated from the supply during switching (i.e., they are left floating), providing for a very low energy consumption and a very fast switching of both the high-level shifted output voltage HLS_OUT and the medium-level shifted output voltage MLS_OUT, e.g., in the order of 200-250 ps.

Figure 5A:
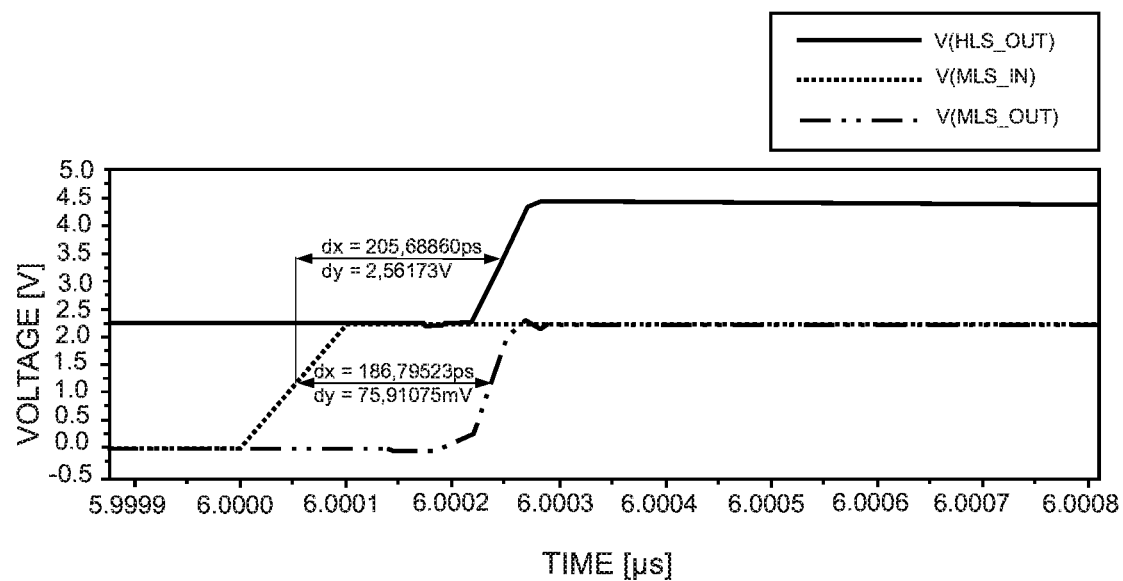

In particular, as shown in FIG. 5A (again relating to the 0→1 switching transition), the transitions of the high-level shifted output voltage HLS_OUT and the medium-level shifted output voltage MLS_OUT occur substantially at a same time, with no appreciable delay therebetween. As will be readily appreciated by those skilled in the art, this feature is of great relevance, e.g., to avoid so called cross-conduction or "crossbar" currents between PMOS and NMOS transistors.

Figure 5B:
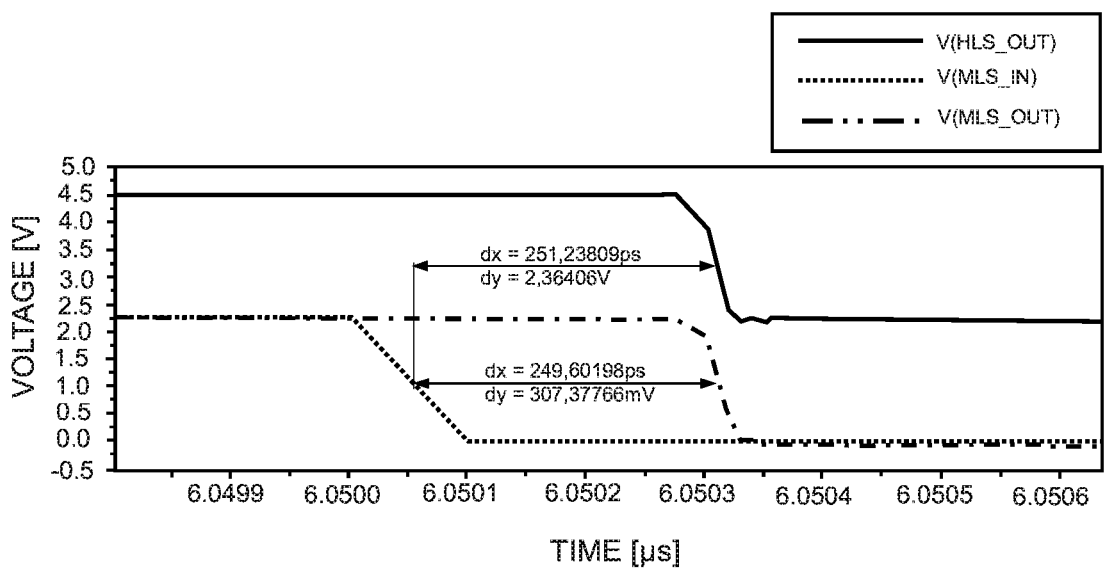

As it will be clear based on the previous discussion, and as shown in FIGS. 5A and 5B, switching of the medium level shifted input voltage MLS_IN from the high to the low value (1→0 switching transition) entails a wholly corresponding operation of the high-level shifting stage 4, again with the latching core 10 being isolated from the supply during commutation, thanks to the biasing signals CP1_BOT, CP2_BOT again overlapping at the high level and the biasing signals CP3_BOT, CP4_BOT again overlapping at the low level.

According to a further aspect of some embodiments, the first high-level shifted input reset signal LS_RESET_P and the second high-level shifted input reset signal LS_RESET_N, respectively active at a low level and at a high level, allow to reset, at any time, the state of the first and second latching units 10a, 10b of the latching core 10, in particular by setting the respective latching output L_OUT to the level-shifted ground reference SHIFTED_GND and, respectively, to the high supply voltage $V_{PH}$.

Moreover, the level shifted input reset signal LS_RESET, at the input of the AND logic gate 18, also sets a reset value for the biasing signals CP1_BOT, CP2_BOT and CP3_BOT, CP4_BOT, independently from the value of the medium level shifted input voltage MLS_IN.

A possible circuit embodiment and the operation of the reset generation stage 6 of the level shifter circuit 1 are now discussed, according to a further aspect of some embodiments.

The reset generation stage 6 assures that the first high-level shifted input reset signal LS_RESET_P and the second high-level shifted input reset signal LS_RESET_N are available at any moment during operation of the level shifter circuit 1, and, moreover, that they are suitably generated with a voltage level that is always referred to proper shifted values, i.e., to the value of the intermediate and high supply voltages $V_{PL}$, $V_{PH}$ (that may even change during operation, e.g., due to charge pump circuit stages generating the same voltages, as will be clear for a person skilled in the art).

As previously discussed, the first high-level shifted input reset signal LS_RESET_P and the second high-level shifted input reset signal LS_RESET_N are to be generated with values switching between the intermediate and the high supply voltages $V_{PL}$, $V_{PH}$.

Figure 6:
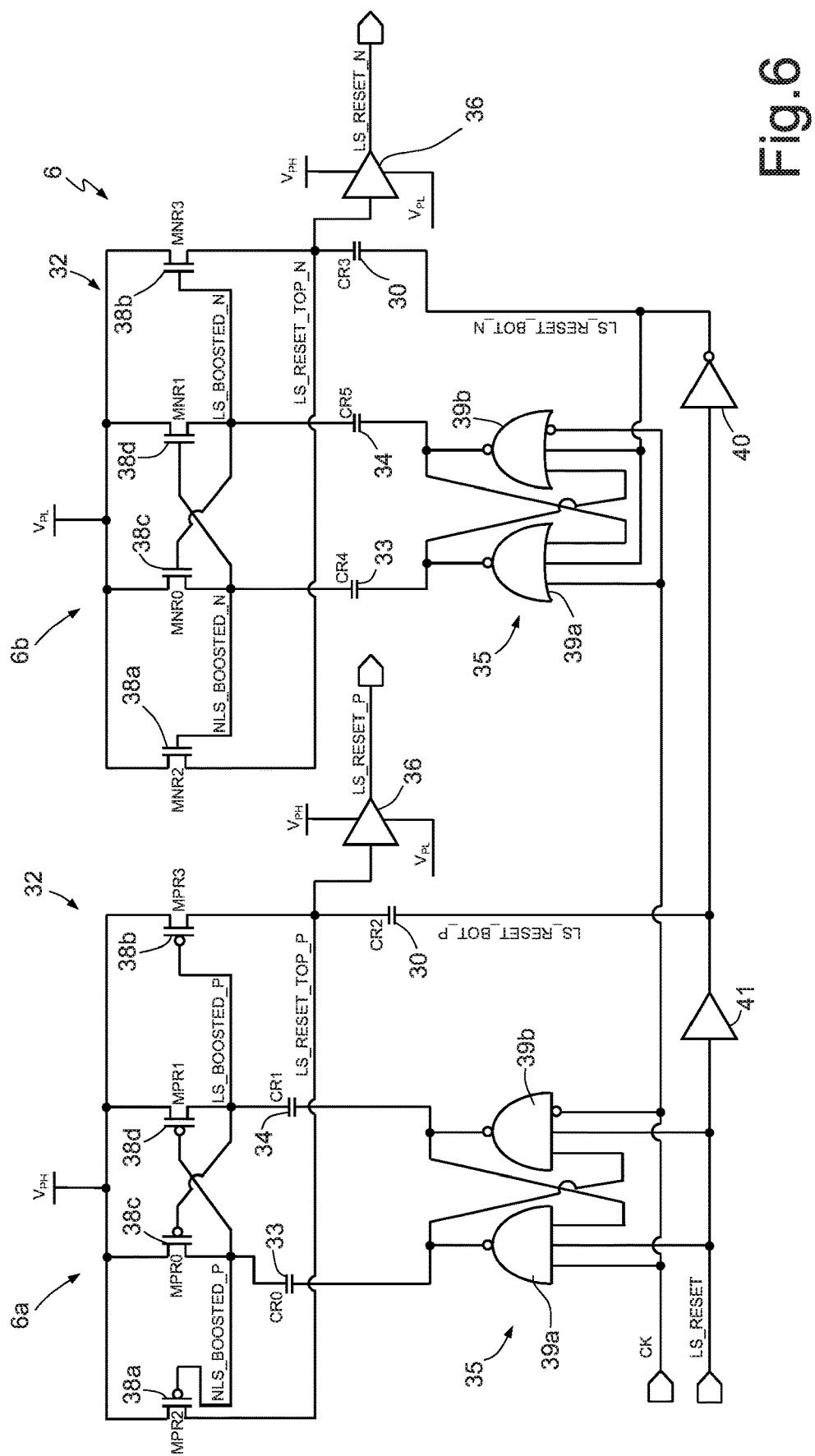
FIG. 6 shows a detailed circuit diagram of a reset buffer stage in the level shifter circuit of FIG. 1.

As shown in FIG. 6, the reset generation stage 6 comprises a first generation circuit 6a for generation of the first high-level shifted input reset signal LS_RESET_P, and a second generation circuit 6b for generation of the second high-level shifted input reset signal LS_RESET_N.

Each of the first and second generation circuits 6a, 6b includes a respective storing capacitor 30, a refreshing unit 32, a first and a second boosting capacitors 33, 34, a boosting unit 35, and an output buffer 36.

In detail, the refreshing unit 32 of the first generation circuit 6a has a supply input coupled to the line at the high supply voltage $V_{PH}$ and includes refresh transistors of the PMOS type. The refreshing unit 32 of the second generation circuit 6b has a supply input coupled to the intermediate supply voltage $V_{PL}$ and includes refresh transistors of the NMOS type.

Each refreshing unit 32 includes, in particular a first and a second refresh transistors 38a, 38b coupled between the supply input and a top plate of the storing capacitor 30 (having a voltage denoted as LS_RESET_TOP_P for the first generation circuit 6a and as LS_RESET_TOP_N for the second generation circuit 6b). The first and second refresh transistors have a gate terminal coupled to a top plate of the first and second boosting capacitor 33, 34, respectively (having voltages denoted as NLS_BOOSTED_P, LS_BOOSTED_P for the first generation circuit 6a and as NLS_BOOSTED_N, LS_BOOSTED_N for the second generation circuit 6b). A third and fourth refresh transistors 38c, 38d are coupled between the supply input and the top plate of the first and second boosting capacitor 33, 34, respectively, and have a gate terminal coupled to the top plate of the second and first boosting capacitor 34, 33, respectively.

The boosting unit 35 includes logic gates (NAND logic gates in case of the first generation circuit 6a and NOR logic gates in case of the second generation circuit 6b), and, in particular, a first logic gate 39a and a second logic gate 39b.

The first logic gate 39a of the first generation circuit 6a has a first input receiving a timing or clock signal CK, a second input receiving the level shifted input reset signal LS_RESET, a third input coupled to an output of the second logic gate 39b, and a respective output coupled to the bottom plate of the first boosting capacitor 33. The first logic gate 39a of the second generation circuit 6b has a first input receiving a timing or clock signal CK, a second input receiving a negated version of the level shifted input reset signal LS_RESET generated by a suitable inverter 40, a third input coupled to an output of the second logic gate 39b, and a respective output coupled to the bottom plate of the first boosting capacitor 33.

The second logic gate 39b of the first generation circuit 6a has a first input coupled to the output of the first logic gate 39a, a second input receiving the level shifted input reset signal LS_RESET, a third input, negated, receiving the clock signal CK (thus inputting a negated version thereof), and an output coupled to the bottom plate of the second boosting capacitor 34. The second logic gate 39b of the second generation circuit 6b has a first input coupled to the output of the first logic gate 39a, a negated version of the level shifted input reset signal LS_RESET generated by the inverter 40, a third input, negated, receiving the clock signal CK (thus inputting a negated version thereof), and an output coupled to the bottom plate of the second boosting capacitor 34.

The bottom plate of the storing capacitor 30 (having a voltage denoted as LS_RESET_BOT_P for the first generation circuit 6a and as LS_RESET_BOT_N for the second generation circuit 6b) is coupled to the output of a buffer 41, which receives at its input the level shifted input reset signal LS_RESET in case of the first generation circuit 6a; or it is coupled to the output of the inverter 40, in case of the second generation circuit 6b, thus receiving the negated version of the same level shifted input reset signal LS_RESET.

The output buffer 36 is referred between the high power supply $V_{PH}$ and the intermediate power supply $V_{PL}$ and has an input coupled to the top plate of the storing capacitor 30 and an output defining the first reset output of the reset generation stage 6 providing the first high-level shifted input reset signal LS_RESET_P, in case of the first generation circuit 6a, or the second reset output of the same reset generation stage 6 providing the second high-level shifted input reset signal LS_RESET_N, in case of the second generation circuit 6b.

Operation of the reset generation stage 6 is now discussed in more details, also referring to the diagrams of the relevant electrical quantities shown in FIGS. 7A-7D. In particular, reference is made first to the first generation circuit 6a.

When the level shifted input reset signal LS_RESET is not active (in the discussed embodiment, being at the high level, i.e., equal to the intermediate supply voltage $V_{PL}$), the combined operation of the boosting unit 35, first and second boosting capacitors 33, 34 and refreshing unit 32 is that of continuously refreshing the voltage value stored in the storing capacitor 30. In particular, the bottom plate of the storing capacitor 30 is at the level of the intermediate supply voltage $V_{PL}$, while the top plate of the same storing capacitor 30 is at the level of the high supply voltage $V_{PH}$.

Accordingly, the value of the first high-level shifted input reset signal LS_RESET_P at the output of the output buffer 36 is high, i.e., equal to the high supply voltage $V_{PH}$. As previously discussed, this value drives in the OFF state the first reset transistor 20a of the high-level shifting stage 4, since no reset is in this case required.

In more details, at each half period of the clock signal CK, either the output of the first logic gate 39a, or the output of the second logic gate 39b is high (while the output of the other logic gate is low), so that either the first or second boosting capacitor 33, 34 provides a boosted voltage at the gate terminals of the first and fourth refresh transistors 38a, 38d, respectively of the second and third refresh transistors 38b, 38c. In particular, when the clock signal CK is at the high level ('1'), the output of the first logic gate 39a is high and the output of the second logic gate 39b is low; whereas, when the clock signal CK is at the low level ('0'), the output of the first logic gate 39a is low and the output of the second logic gate 39b is high.

Accordingly, at each half period of the clock signal CK, the top plate of the storing capacitor 30 is refreshed to the level of the high supply voltage $V_{PH}$, either by the first and fourth refresh transistors 38a, 38d, or by the second and third refresh transistors 38b, 38c, being in the ON state.

When the reset signal is to be activated, the level shifted input reset signal LS_RESET switches to the low level (in the discussed embodiment, being equal to the ground reference GND), so that the output of both the first and the second logic gates 39a, 39b is brought to the high level. The gate terminals of all refresh transistors 38a, 38b, 38c, 38d is high, and the same refresh transistors are all set in the OFF state, thus stopping refresh of the storing capacitor 30 to the high supply voltage $V_{PH}$.

Therefore, the top plate of the same storing capacitor 30 undergoes a same voltage drop as the bottom plate, shifting from $V_{PH}$ to $V_{PH}-V_{PL}$, i.e., to the value of the intermediate supply voltage $V_{PL}$, since in the discussed embodiment it is assumed that $V_{PH} \approx 2 \cdot V_{PL}$.

Accordingly, the value of the first high-level shifted input reset signal LS_RESET_P at the output of the output buffer 36 shifts to the low state, i.e., being equal to the intermediate supply voltage $V_{PL}$. As previously discussed, this value drives in the ON state the first reset transistor 20a of the high-level shifting stage 4, implementing reset of the second latching unit 10b.

It is noted that this reset condition may be maintained as long as the storing capacitor 30 maintains its charge, for example, for a time interval in the order of 1 μs (as in the example shown in FIGS. 7A-7D).

Operation of the second generation circuit 6b corresponds to that of the first generation circuit 6a, so that it is not discussed in details.

In this case, when reset is not active, the bottom plate of the respective storing capacitor 30 is set at the ground reference GND while the top plate of the same storing capacitor 30 is continuously refreshed at the value of the intermediate supply voltage $V_{PL}$ that is provided at the supply input of the second generation circuit 6b through the combined operation of the boosting unit 35, first and second boosting capacitors 33, 34, and refreshing unit 32.

Accordingly, the value of the second high-level shifted input reset signal LS_RESET_N at the output of the respective output buffer 36 is low, i.e., equal to the intermediate supply voltage $V_{PL}$. As previously discussed, this value drives in the OFF state the second reset transistor 20b of the high-level shifting stage 4, since no reset is in this case required.

When the reset signal is to be activated and the level shifted input reset signal LS_RESET switches to the low level, the bottom plate of the storing capacitor 30 experiences an increase equal to the value of the intermediate supply voltage $V_{PL}$, while refresh of the top plate thereof is stopped (since the output of both first and second logic gates 39a, 39b is brought to the low level, thus driving all refresh transistors 38a-38d in the OFF state).

Therefore, the top plate of the same storing capacitor 30 undergoes a same voltage increase as the bottom plate, shifting from $V_{PL}$ to $V_{PL}+V_{PL}$, i.e., to the value of the high supply voltage $V_{PH}$, since in the discussed embodiment it is assumed that $V_{PH} \approx 2 \cdot V_{PL}$.

Accordingly, the value of the second high-level shifted input reset signal LS_RESET_N at the output of the output buffer 36 shifts to the high state, i.e., being equal to the high supply voltage $V_{PH}$. As previously discussed, this value drives in the ON state the second reset transistor 20b of the high-level shifting stage 4, implementing reset of the first latching unit 10a.

As shown in FIGS. 7A-7C, the value of the first and second high-level shifted reset signals LS_RESET_P LS_RESET_N follows possible variations of the supply voltage (in the example, an increase of the high supply voltage $V_{PH}$ is shown), in a very short time.

Indeed, just a few clock cycles (e.g., less than five clock cycles) are sufficient for the refresh operations performed on the storing capacitor 30 to bring the voltage of the top plate of the same storing capacitor 30 to the new value of the supply voltage (in the example shown, experiencing a corresponding increase as the high supply voltage $V_{PH}$).

As mentioned previously, the level shifter circuit 1 may find advantageous application in an integrated non-volatile memory device.

Figure 8:
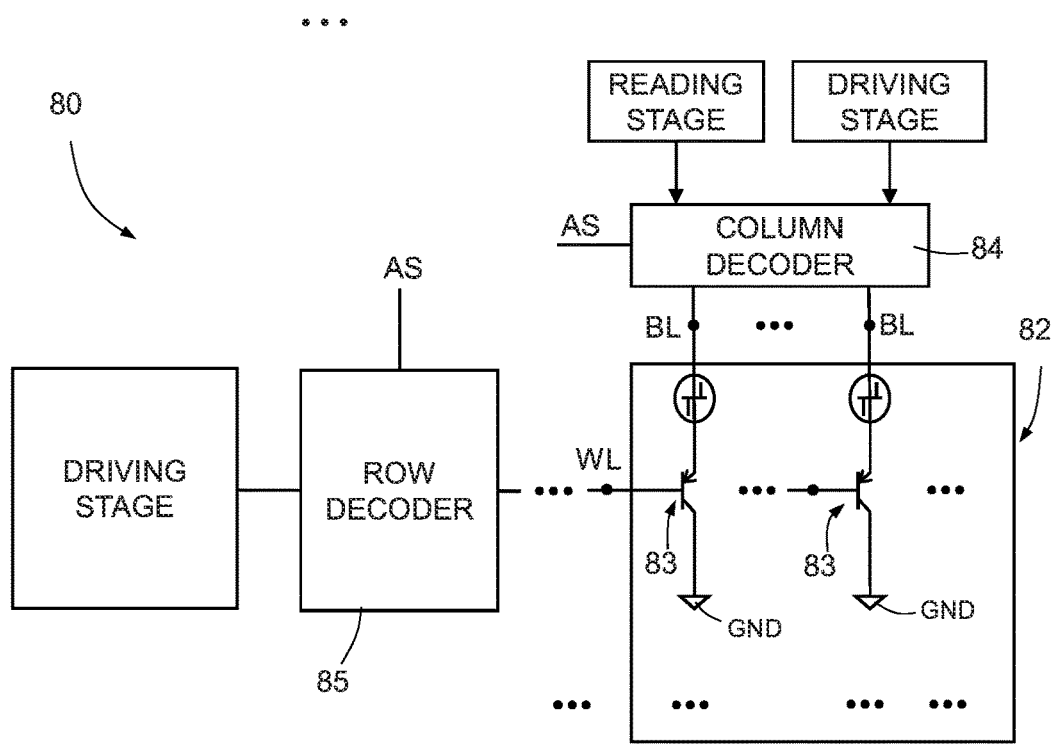
FIG. 8 shows a block diagram of a memory device using the level shifter circuit of FIG. 1, in corresponding address-decoder stages.

As illustrated schematically in FIG. 8, a non-volatile memory device, designated by 80, comprises in general a memory array 82 constituted by a plurality of memory cells 83, arranged in wordlines WL and bitlines BL.

Each memory cell 83 is constituted by a storage element, including a phase-change material element (for example, a chalcogenide, such as GST) in the example shown of PCM memories and an access transistor (in the case shown a BJT transistor), appropriately connected to a respective bitline BL and to a respective wordline WL.

A column decoder 84 and a row decoder 85 enable selection of the memory cells 83 on the basis of address signals received at the input (generated in a known way and designated as a whole by AS) and appropriate decoding schemes. In particular, the column decoder 84 and the row decoder 85 enable selection of the corresponding bitlines BL and of the corresponding wordlines WL, each time addressed, enabling their biasing at desired voltage and current values during the reading and programming operations by using appropriate driving stages.

Moreover, a reading stage is selectively coupled to the memory array 82 via the column decoder 84, during the operations of reading of the contents of the memory cells 83.

The level shifter circuit 1 according to the present solution may, for example, be used within the column and row decoders 84, 85 to enable generation of the appropriate quantities, for selection and biasing of the bitlines BL and wordlines WL.

Figure 9A:
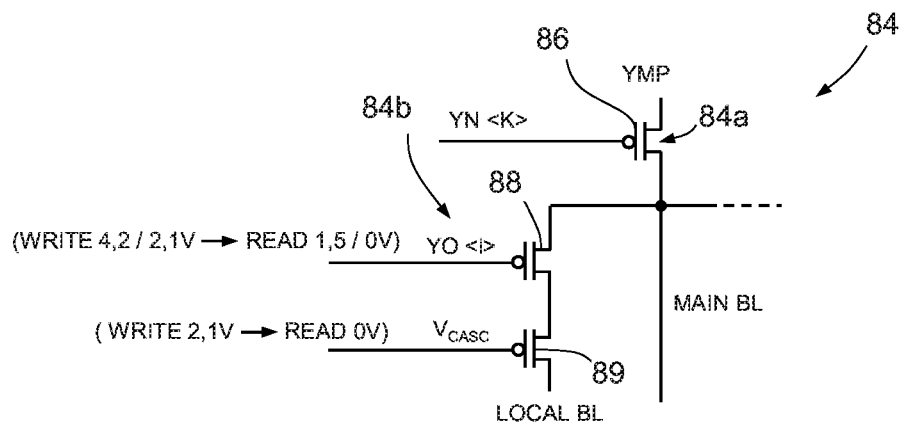
FIG. 9A is a schematic depiction of a portion of a column decoder in the memory device of FIG. 8.

In particular, as schematically shown in in FIG. 9A, the column decoder 84 may have, in a per se known manner, a hierarchical decoding structure, with a number of decoding stages.

A first decoding stage 84a includes a plurality of global-selection transistors 86 (only one of which is shown in the schematic depiction of FIG. 9A), in the example of a PMOS type, which enable selection and biasing of a respective global bitline (or main bitline) MBL, for a respective sector of the memory array 82 (here not shown).

Each global-selection transistor 86 receives on a control terminal thereof a respective global-selection signal YN<k>, having a first value, for example a low value, for connecting the respective global bitline MBL to a respective module (driver) of the driving stage of the non-volatile memory device 80, which supplies a driving signal YMP, and a second value, in the example high, for disconnecting the same global bitline MBL from the driving stage.

A second decoding stage 84b includes a plurality of local-selection transistors 88 (again, only one of which is shown in FIG. 9A), in the example of a PMOS type, for each sector of the memory array 82, each connected between a respective global bitline MBL and a respective local bit line BL to which memory cells 83 are connected (not illustrated herein).

Each local-selection transistor 88 receives on a control terminal thereof a respective local-selection signal YO<i>, which has a first value, for example low, for connecting the global bitline MBL associated to the respective sector to a respective local bitline BL (and to the associated memory cells 83), and a second value, in the example high, for disconnecting the same global bitline MBL from the respective bitline BL.

Moreover, a cascode transistor 89 is coupled between the local bitline BL and each local-selection transistor 88, having a control terminal receiving a cascode voltage $V_{CASC}$, with a value suitable to avoid over-voltages across the decoder transistor terminals (for example, transistors may be sized so that a maximum voltage allowed between their terminals is equal to 1.8 V).

The global-selection signal YN<k> and the local-selection signal YO<i> are referred to shifted voltage values, e.g., equal to 4.2 V or 2.1 V depending on the memory operation being performed and may be generated by a respective level shifter circuit 1 (as the one previously disclosed in details). Also the cascode voltage $V_{CASC}$ is required to have suitable shifted voltages, e.g., equal to 2.1 V and may be also generated by level shifter circuit 1.

Advantageously, the two parallel shifting paths present in the level shifter circuit 1 may be exploited to generate the intermediate supply voltage $V_{PL}$, in this case corresponding to the cascode voltage $V_{CASC}$; and the high supply voltage $V_{PH}$, in this case corresponding to the global-selection signal YN<k> and local-selection signal YO<i>.

The presence of level shifter circuits 1 is also required in the row decoders 85.

Figure 9B:
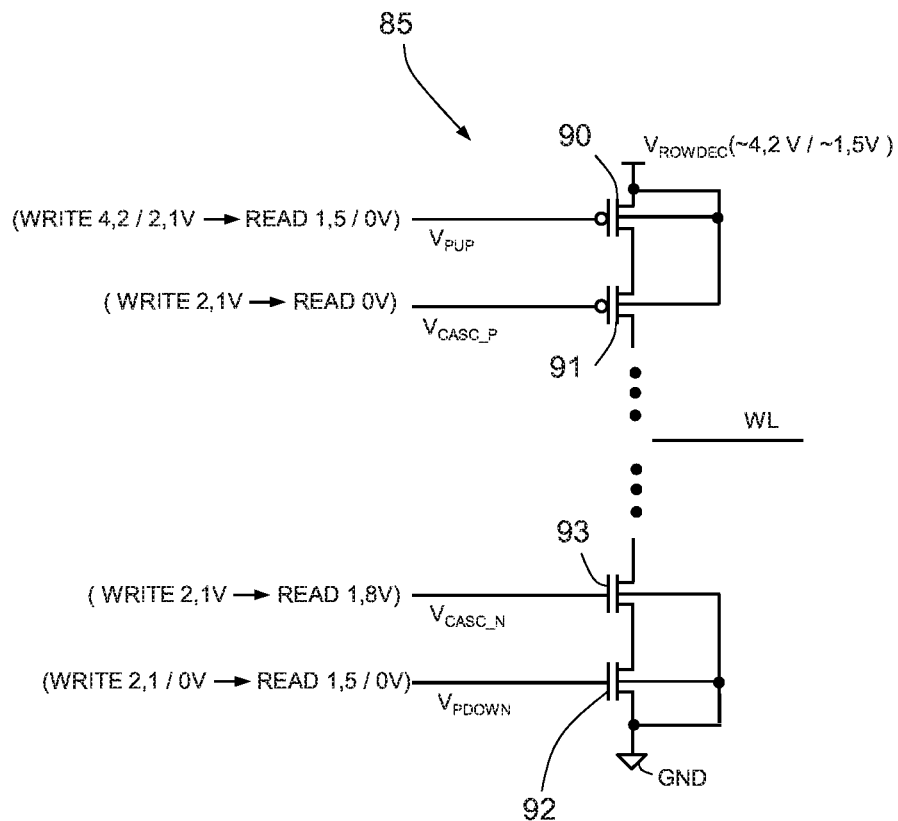
FIG. 9B is a schematic depiction of a portion of a row decoder in the memory device of FIG. 8.

In particular, as schematically shown in in FIG. 9B, the row decoder 85 may envisage that word lines WL are normally biased to a positive voltage in an unselected status, and grounded when selected.

Accordingly, for each word line WL, the row decoder 84 may include a pull-up transistor 90, of a PMOS type, controllable to couple the word line WL to a row decoder supply voltage $V_{ROWDEC}$ (e.g., equal to 4.2 V for writing operations or 1.5 V for reading operations); a first cascode transistor 91, also of a PMOS type, may again be coupled between the word line WL and the respective pull-up transistor 90, for overvoltage protection, receiving a first cascode voltage $V_{CASCP}$ at the control terminal.

The control terminal of the a pull-up transistor 90 may use, e.g., voltages $V_{PUP}$ equal to 4.2 V or 2.1 V during writing and 1.5 V or 0 V during reading operations; while the first cascode voltage $V_{CASCP}$ provided to the control terminal of the first cascode transistor 91 may be equal to 2.1 V or 0 V during writing or, respectively, reading operations.

Likewise, the row decoder 85 may include a pull-down transistor 92, of a NMOS type, controllable to couple the word line WL to a ground reference GND; a second cascode transistor 93, also of a NMOS type, may again be coupled between the word line WL and the respective pull-down transistor 92, for overvoltage protection, receiving a second cascode voltage $V_{CASCN}$ at the control terminal.

The control terminal of the pull-down transistor 92 may use, e.g., voltages $V_{PDOWN}$ equal to 2.1 V or 0 V during writing and 1.5 V or 0 V during reading operations; while the second cascode voltage $V_{CASCN}$ provided to the control terminal of the second cascode transistor 93 may be equal to 2.1 V or 1.8 V during writing or reading operations, respectively.

Advantageously, the two parallel shifting paths present in the level shifter circuit 1 may in this case be exploited to generate the first and second cascode voltages $V_{CASCP}$, $V_{CASCN}$, used for the above discussed different voltage domains. In particular, simultaneous switching transitions obtained for the first and second cascode voltages $V_{CASCP}$, $V_{CASCN}$ allow avoiding crossbar currents between supply and ground reference in the row decoder 85.

The advantages of the solution proposed are clear from the foregoing description.

In any case, it is again underlined that it allows achieving fast level transitions, low power consumption and small area occupation.

Moreover, in the proposed solution, level shifting operations in the medium-voltage and high-voltage domains are performed in parallel, with minimum delays between the level transitions, so as to avoid current cross-conductions, e.g., through NMOS and PMOS transistors.

The level shifter circuit 1 also provides a dedicated reset scheme for initialization, with properly level-shifted reset signals, which are also able to adapt to the supply voltage values that are applied.

The proposed solution is therefore particularly advantageous in particularly scaled technologies (for example, the 28-nm FD-SOI technology), and, in general, for applications in non-volatile memory devices, for example in corresponding column and/or row decoders.

Finally, it is clear that modifications and variations may be made to what has been described and illustrated herein, without thereby departing from the scope of the present invention, as defined in the annexed claims.

In particular, it is underlined that, even though particular reference has been made to the use of the level shifter circuit within non-volatile memory devices, the solution described may be advantageously employed in any application in which level shifting of an input signal into an output signal with fast transitions, low circuit complexity and low power consumption is required.

What is claimed is:

1. A level shifter circuit configured to receive an input signal and generate a first output signal based on the input signal, the input signal switching within a first voltage range and the first output signal switching within a second voltage range that is higher than the first voltage range, the level shifter circuit comprising:
    a supply voltage node configured to receive a supply voltage;
    a reference voltage node configured to receive a reference voltage;
    a latching core comprising a latching input terminal, latching output terminals, a supply line coupled to the supply voltage node, and a reference line coupled to the reference voltage node;
    a plurality of capacitive coupling elements coupled to the latching input terminal and the latching output terminals;
    a driving stage configured to generate a plurality of biasing signals based on the input signal, and to bias the plurality of capacitive coupling elements with the plurality of biasing signals; and
    a decoupling stage configured to be driven by the driving stage through the plurality of capacitive coupling elements to decouple the supply line from the supply voltage node and the reference line from the reference voltage node during switching of the input signal.

2. The circuit of claim 1, wherein the circuit is further configured to generate a second output signal switching within a third voltage range, the third voltage range being intermediate between the first voltage range and the second voltage range, wherein the first and the second output signals have corresponding and concurrent switching transitions.

3. The circuit of claim 1, wherein the decoupling stage comprises:
a first decoupling unit that comprises first and second decoupling PMOS transistors coupled between the supply line and the supply voltage node, the first and second decoupling PMOS transistors having control terminals configured to be driven by the driving stage through the plurality of capacitive coupling elements; and
a second decoupling unit that comprises first and second decoupling NMOS transistors coupled between the reference line and the reference voltage node, the first and second decoupling NMOS transistors having control terminals configured to be driven by the driving stage through the plurality of capacitive coupling elements, wherein the driving stage is configured to generate a first and a second biasing signals of the plurality of biasing signals with overlapping positive values during switching of the input signal to drive the control terminals of the first and second decoupling PMOS transistors through the plurality of capacitive coupling elements, and a third and a fourth biasing signals of the plurality of biasing signals with overlapping negative values during switching of the input signal to drive the control terminals of the first and second decoupling NMOS transistors through the plurality of capacitive coupling elements.

4. The circuit of claim 3, wherein the driving stage comprises:
a first driving unit of a NAND logic type that comprises a first and a second logic gates configured to provide the first and second biasing signals, wherein the first and second biasing signals have opposite values except for an overlapping interval during switching of the input signal during which the first and second biasing signals have overlapping positive values; and
a second driving unit of a NOR logic type that comprises a first and a second logic gates configured to provide the third and fourth biasing signals, wherein the third and fourth biasing signals have opposite values except for the overlapping interval during switching of the input signal during which the third and fourth biasing signals have overlapping negative values, the overlapping interval being a function of a logic-gate propagation delay between the first and the second logic gates of the first and second driving units.

5. The circuit of claim 4, wherein:
the first logic gate of the first driving unit comprises a first input configured to receive a biasing input signal, a second input coupled to an output of the second logic gate of the first driving unit, and an output configured to provide the first biasing signal, the biasing input signal being a function of the input signal;
the second logic gate of the first driving unit comprises a first input configured to receive a negated biasing input signal, a second input coupled to the output of the first logic gate of the first driving unit, and the output configured to provide the second biasing signal;
the first logic gate of the second driving unit comprises a first input configured to receive the biasing input signal, a second input coupled to an output of the second logic gate of the second driving unit, and an output configured to provide the third biasing signal; and
the second logic gate of the second driving unit comprises a first input configured to receive the negated biasing input signal, a second input coupled to the output of the first logic gate of the second driving unit, and the output configured to provide the fourth biasing signal.

6. The circuit of claim 3, wherein the latching core comprises:
a first latching unit having a latching input coupled to a top plate of a first capacitive coupling element of the plurality of capacitive coupling elements, and a latching output coupled to a top plate of a second capacitive coupling element of the plurality of capacitive coupling elements, wherein the latching input and output of the first latching unit are coupled to the control terminals of the decoupling PMOS transistors, and wherein bottom plates of the first and second capacitive coupling elements are coupled to the driving stage and configured to receive the first and second biasing signals; and
a second latching unit having a latching input coupled to a top plate of a third capacitive coupling element of the plurality of capacitive coupling elements, and a latching output coupled to a top plate of a fourth capacitive coupling element of the plurality of capacitive coupling elements, wherein the latching input and output of the second latching unit are coupled to the control terminals of the first and second decoupling NMOS transistors, and wherein bottom plates of the third and fourth capacitive coupling elements are coupled to the driving stage and configured to receive the third and fourth biasing signals.

7. The circuit of claim 6, further comprising:
a first output configured to provide a high-level shifted output signal for generation of the first output signal, the first output being coupled to the top plate of the fourth capacitive coupling element via an inverting stage, the inverting stage being referred to the supply voltage and the reference voltage; and
a second output configured to provide a medium-level shifted output signal for generation of a second output signal, the medium-level shifted output signal switching within a third voltage range, the third voltage range being intermediate between the first and the second voltage range, the second output being coupled to the bottom plate of the fourth capacitive coupling element via an inverting buffer, wherein the first and the second output signals have corresponding and concurrent switching transitions.

8. The circuit of claim 1, further comprising:
a reset generation stage configured to generate a first level-shifted reset signal at a first reset output and a second level-shifted reset signal at a second reset output to initialize the latching core based on an input reset signal and a clock signal;
a first reset transistor of the PMOS type coupled between the supply line and a first latching output terminal of the latching output terminals and having a control terminal configured to receive the first level-shifted reset signal; and
a second reset transistor of the NMOS type coupled between the reference line and a second latching output terminal of the latching output terminals and having a control terminal configured to receive the second level-shifted reset signal.

9. The circuit of claim 8, wherein the reset generation stage comprises:
a first generation circuit configured to generate the first level-shifted reset signal, the first generation circuit comprising:
a first storing capacitor having a bottom plate configured to receive the input reset signal and a top plate coupled to the first reset output via a first output buffer, the first output buffer having a first supply input configured to receive the supply voltage and a second supply input configured to receive an intermediate voltage lower than the supply voltage,
a first refreshing unit configured to be supplied by the supply voltage and configured to refresh a voltage of the top plate of the first storing capacitor to a value of the supply voltage continuously at each cycle of the clock signal when the input reset signal is in an inactive state, and stop refreshing the first storing capacitor when the input reset signal switches to an active state; and
a second generation circuit configured to generate the second level-shifted reset signal, the second generation circuit comprising:
a second storing capacitor having a bottom plate configured to receive a negated input reset signal and a top plate coupled to the second reset output via a second output buffer, the second output buffer having a first supply input configured to receive the supply voltage and a second supply input configured to receive the intermediate voltage,
a second refreshing unit configured to be supplied by the intermediate voltage and configured to refresh a voltage of the top plate of the second storing capacitor to a value of the intermediate voltage continuously at each cycle of the clock signal when the input reset signal is in the inactive state, and stop refreshing the second storing capacitor when the input reset signal switches to the active state.

10. The circuit of claim 9, wherein:
the first refreshing unit comprises a first refresh transistor and a second refresh transistor of the PMOS type coupled between the supply voltage node and the top plate of the first storing capacitor;
the second refreshing unit comprises a third refresh transistor and a fourth refresh transistor of the NMOS type coupled between the intermediate voltage and the top plate of the second storing capacitor;
the first generation circuit further comprises a first boosting capacitor having a top plate coupled to a control terminal of the first refresh transistor and a second boosting capacitor having a top plate coupled to a control terminal of the second refresh transistor, and a first boosting unit coupled to bottom plates of the first and second boosting capacitors, the first boosting unit configured to drive the bottom plates of the first and second boosting capacitors with opposite-level boosting signals at each cycle of the clock signal when the input reset signal is in an inactive state, and with boosting signals of a same level to turn off the first and second refresh transistors upon the input reset signal switching to an active state; and
the second generation circuit further comprises a third boosting capacitor having a top plate coupled to a control terminal of the third refresh transistor and a fourth boosting capacitor having a top plate coupled to a control terminal of the fourth refresh transistor; and
a second boosting unit coupled to bottom plates of the third and fourth boosting capacitors, the second boosting unit configured to drive the bottom plates of the third and fourth boosting capacitors with opposite-level boosting signals at each cycle of the clock signal when the input reset signal is in the inactive state, and with boosting signals of a same level to turn off the third and fourth refresh transistors upon the input reset signal switching to the active state.

11. The circuit of claim 10, wherein:
the first boosting unit is of a NAND logic type and comprises a first logic gate and a second logic gate, the first logic gate having a first input configured to receive the clock signal, a second input configured to receive the input reset signal, a third input coupled to an output of the second logic gate, and an output configured to provide a first boosting signal of the boosting signals to the first boosting capacitor, the second logic gate comprising a first input configured to receive a negated clock signal, a second input configured to receive the input reset signal, and a third input coupled to the output of the first logic gate, wherein the output of the second logic gate is configured to provide a second boosting signal of the boosting signals to the second boosting capacitor; and
the second boosting unit is of a NOR logic type and comprises a third logic gate and a fourth logic gate the third logic gate having a first input configured to receive the clock signal, a second input configured to receive a negated input reset signal, a third input coupled to the output of the first logic gate, and an output configured to provide a third boosting signal of the boosting signals to the third boosting capacitor, the fourth logic gate comprising a first input configured to receive a negated clock signal, a second input configured to receive the negated input reset signal, and a third input coupled to the output of the third logic gate, wherein the output of the fourth logic gate is configured to provide a fourth boosting signal of the boosting signals to the fourth boosting capacitor.

12. A device comprising a decoder stage configured to be coupled to a memory having a memory array that comprises a plurality of memory cells arranged in wordlines and bitlines, the decoder stage configured to select and bias the wordlines or bitlines as a function of address signals, wherein the decoder stage comprises a plurality of level shifter circuits, each level shifter circuit configured to receive an input signal and generate a first output signal based on the input signal, the input signal switching within a first voltage range and the first output signal switching within a second voltage range that is higher than the first voltage range, the level shifter circuit comprising:
a latching core comprising a latching input terminal, latching output terminals, a supply line configured to be supplied by a supply voltage, and a reference line configured to be coupled to a reference voltage;
a plurality of capacitive coupling elements coupled to the latching input terminal and the latching output terminals;
a driving stage configured to generate a plurality of biasing signals based on the input signal, and bias the plurality of capacitive coupling elements with the plurality of biasing signals; and
a decoupling stage configured to be driven by the driving stage through the plurality of capacitive coupling elements to decouple the supply line from the supply voltage and the reference line from the reference voltage during switching of the input signal.

13. The device of claim 12, wherein the decoder stage further comprises a plurality of selection transistors configured to select the wordlines or the bitlines for memory operations, and cascode transistors coupled to the selection transistors, wherein the plurality of level shifter circuits is configured to generate respective control signals for control terminals of the selection transistors or respective cascode voltages for control terminals of the cascode transistors.

14. The device of claim 12, further comprising the memory, wherein the memory is coupled to the decoder stage.

15. The device of claim 14, wherein the memory is of a PCM type.

16. A method of operating a level shifter circuit, the method comprising:
receiving an input signal switching within a first voltage range;
generating a first output signal based on the input signal switching within a second voltage range that is different than the first voltage range;
receiving a supply voltage, at a supply line of a latching core;
receiving a reference voltage at a reference line of the latching core;
generating a plurality of biasing signals based on the input signal to bias a plurality of capacitive coupling elements, the plurality of capacitive coupling elements coupled to a latching input terminal of the latching core and a latching output terminal of the latching core;
decoupling the supply line from the supply voltage and the reference line from the reference voltage during switching of the input signal by using the capacitive coupling elements; and
generating a second output signal switching within a third voltage range, the third voltage range being intermediate between the first voltage range and the second voltage range, wherein the first and the second output signals have corresponding and concurrent switching transitions.

17. The method of claim 16, wherein the first voltage range comprises a range between 0 V and 1.35 V, the second voltage range comprises a range between 2.25 V and 4.5 V and the third voltage range comprises a range between 0 V and 2.25 V.

18. The method of claim 16, wherein decoupling the supply line from the supply voltage comprises using first and second decoupling PMOS transistors coupled between the supply line and a line at the supply voltage and having control terminals coupled to the capacitive coupling elements, and wherein decoupling the reference line from the reference voltage comprises using first and second decoupling NMOS transistors coupled between the reference line and a line at the reference voltage and having control terminals coupled to the capacitive coupling elements.

19. A method of operating a level shifter circuit, the method comprising:
receiving an input signal switching within a first voltage range;
generating a first output signal based on the input signal switching within a second voltage range that is different than the first voltage range;
receiving a supply voltage, at a supply line of a latching core;
receiving a reference voltage at a reference line of the latching core;
generating a plurality of biasing signals based on the input signal to bias a plurality of capacitive coupling elements, the plurality of capacitive coupling elements coupled to a latching input terminal of the latching core and a latching output terminal of the latching core;
decoupling the supply line from the supply voltage and the reference line from the reference voltage during switching of the input signal by using the capacitive coupling elements; and
initializing the latching core by generating a first and second level-shifted reset signals based on an input reset signal and a clock signal.

20. The method of claim 16, further comprising:
controlling a control terminal of a PMOS transistor with the first output signal; and
controlling a control terminal of an NMOS transistor with the second output signal.

* * * * *